(12) United States Patent
Chengson

(10) Patent No.: US 10,455,691 B1
(45) Date of Patent: Oct. 22, 2019

(54) GRID ARRAY PATTERN FOR CROSSTALK REDUCTION

(71) Applicant: Juniper Networks, Inc., Sunnyvale, CA (US)

(72) Inventor: David P. Chengson, Aptos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 29 days.

(21) Appl. No.: 15/934,826

(22) Filed: Mar. 23, 2018

Related U.S. Application Data

(60) Provisional application No. 62/477,636, filed on Mar. 28, 2017.

(51) Int. Cl.
*H05K 1/02* (2006.01)
*H05K 1/11* (2006.01)
*H05K 3/42* (2006.01)
*H05K 3/34* (2006.01)

(52) U.S. Cl.
CPC ......... *H05K 1/0228* (2013.01); *H05K 1/0245* (2013.01); *H05K 1/112* (2013.01); *H05K 3/3436* (2013.01); *H05K 3/429* (2013.01); *H05K 2201/10325* (2013.01); *H05K 2201/10719* (2013.01); *H05K 2201/10734* (2013.01)

(58) Field of Classification Search
CPC ...... H05K 1/0228; H05K 1/0245; H05K 1/11; H05K 1/111; H05K 1/112; H05K 2201/10734; H05K 2201/10719; H05K 2201/097; H05K 2201/09263; H05K 2201/0979; H05K 3/3436; H05K 3/429; H05K 2201/10325; H01L 23/49822; H01L 23/50; H01L 23/52; H01L 23/522; H01L 23/5221
See application file for complete search history.

(56) References Cited

U.S. PATENT DOCUMENTS

| | | |
|---|---|---|
| 7,180,011 B1 | 2/2007 | Hall et al. |
| 9,089,060 B1 | 7/2015 | Azeroual et al. |
| 2003/0183919 A1 | 10/2003 | Devnani et al. |
| 2004/0268271 A1 | 12/2004 | Agrawal et al. |

(Continued)

OTHER PUBLICATIONS

Co-pending U.S. Appl. No. 15/934,813, filed Mar. 23, 2018.

*Primary Examiner* — Steven T Sawyer
(74) *Attorney, Agent, or Firm* — Harrity & Harrity, LLP

(57) ABSTRACT

An apparatus may include via pads and grid array pads associated with facilitating a connection through a package and to a component, and vias that are electrically connected to the via pads, wherein the vias are used to support high-speed differential signal pairs that are capable of causing crosstalk onto other high-speed differential signal pairs while propagating through the package. The apparatus may include interconnects that electrically connect the vias to the grid array pads, and that are capable of routing the high-speed differential signal pairs in a way that offsets the crosstalk that the high-speed differential signal pairs are capable of causing while propagating through the package. The apparatus may include additional interconnects that electrically connect the vias to additional vias that are to be used to facilitate routing the high-speed differential signal pairs to the component, without the high-speed differential signal pairs propagating through a printed circuit board.

20 Claims, 9 Drawing Sheets

(56) References Cited

U.S. PATENT DOCUMENTS

| | | |
|---|---|---|
| 2006/0180917 A1 | 8/2006 | Djordjevic et al. |
| 2006/0192282 A1* | 8/2006 | Suwa ................... H01L 23/50 |
| | | 257/723 |
| 2007/0097658 A1 | 5/2007 | Yang et al. |
| 2007/0205498 A1 | 9/2007 | Djordjevic et al. |
| 2008/0238585 A1* | 10/2008 | Tokoro ................... H01P 3/08 |
| | | 333/247 |
| 2008/0266019 A1* | 10/2008 | Fusayasu ................ H04B 3/34 |
| | | 333/12 |
| 2009/0289348 A1 | 11/2009 | Tang et al. |
| 2012/0187564 A1 | 7/2012 | Tsuge et al. |
| 2014/0014404 A1 | 1/2014 | Hinton et al. |
| 2014/0160707 A1* | 6/2014 | Zhang ................. H05K 1/0298 |
| | | 361/767 |
| 2014/0264907 A1 | 9/2014 | Altunyurt et al. |
| 2014/0300003 A1 | 10/2014 | Kariyazaki et al. |

\* cited by examiner

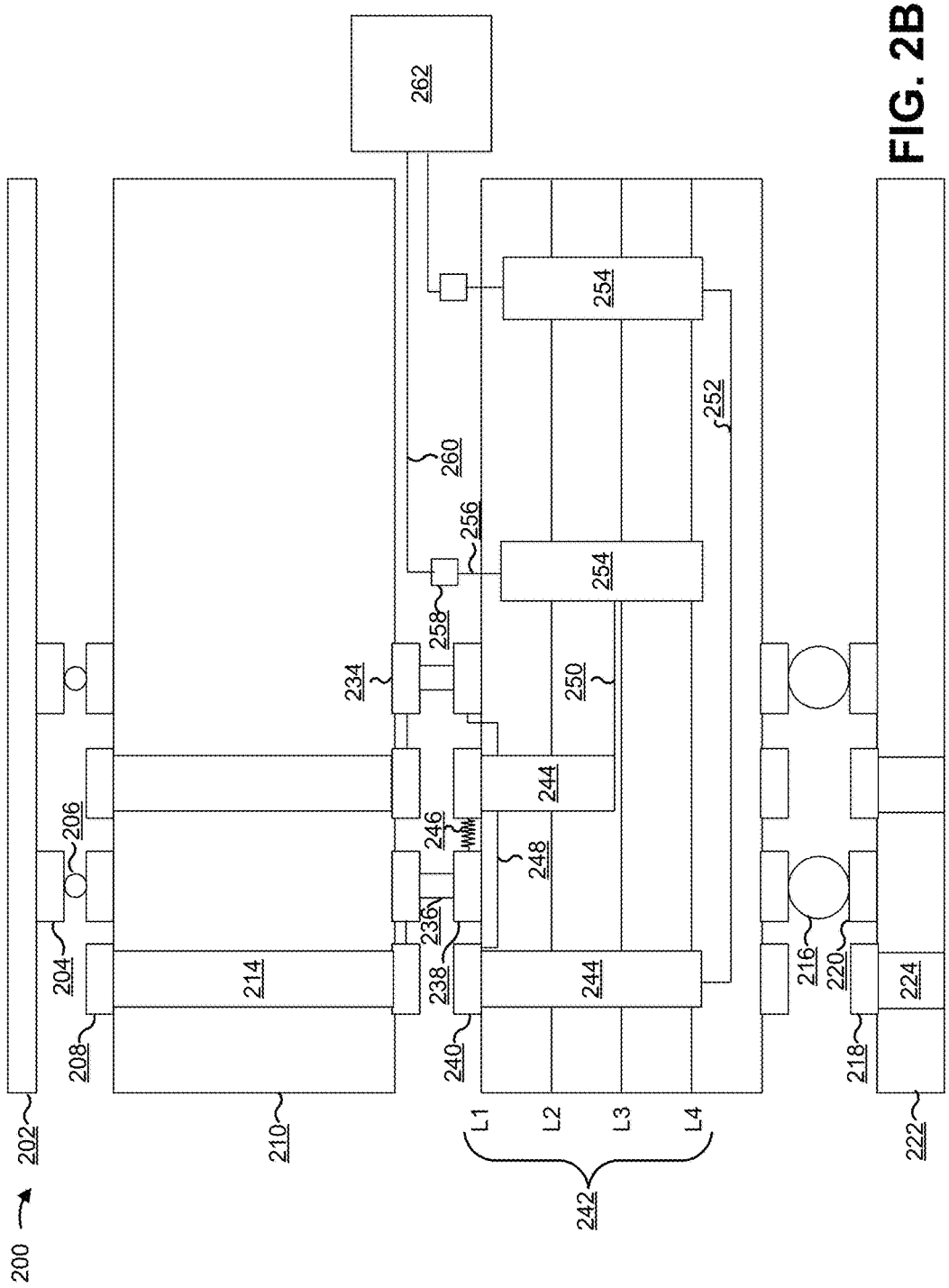

GRID ARRAY PATTERN FOR CROSSTALK REDUCTION

RELATED APPLICATION

This application claims priority under 35 U.S.C. § 119 to U.S. Provisional Patent Application No. 62/477,636, filed on Mar. 28, 2017, the content of which is incorporated by reference herein in its entirety.

BACKGROUND

A printed circuit board (PCB) assembly may include one or more components to facilitate transmitter and receiver signal routing for high speed data connections. For example, the PCB assembly may include a PCB, a grid array (GA) package, and an integrated circuit, wherein the high-speed signals travel to and from the integrated circuit by traveling through the PCB and the GA package. Additionally, high speed signals may carry information at rates of 25 Gigabits per second (Gbps) or greater, which may cause significant signal integrity disturbances as a result of reflection, crosstalk, and ground bounce. The signal integrity disturbances may result in reduced network performance.

SUMMARY

According to some possible implementations, a socket may include a set of pads associated with facilitating a connection through a package and to a component. The set of pads may include a set of via pads and a set of grid array (GA) pads. The socket may include a first set of vias that are electrically connected to the set of via pads and that are connected to a set of layers that are perpendicular to the first set of vias. The first set of vias may be used to support high-speed differential signal pairs. The high-speed differential signal pairs may include a first high-speed differential signal pair that includes a first differential signal and a second differential signal, wherein the first differential signal is capable of causing crosstalk onto a particular differential signal, of a second high-speed differential signal pair, while propagating through the package. The socket may include a first set of interconnects that electrically connect the first set of vias to the set of GA pads. The first set of interconnects may include a first interconnect and a second interconnect that are capable of routing the first differential signal, and the second differential signal, respectively, to offset the crosstalk that the first differential signal is capable of causing onto the particular differential signal while propagating through the package. The socket may include a second set of interconnects that electrically connect the first set of vias to a second set of vias that are to be used to facilitate routing the high-speed differential signal pairs to the component, without the high-speed differential signal pairs propagating through a printed circuit board (PCB). The first differential signal and the second differential signal may be capable of being routed to the component through interconnects, of the second set of interconnects, and through vias, of the second set of vias.

According to some possible implementations, a printed circuit board (PCB) assembly may include a component capable of sending or receiving high-speed differential signal pairs. The high-speed differential signal pairs may include a first high-speed differential signal pair and a second high-speed differential signal pair, and the first high-speed differential signal pair may include a first differential signal and a second differential signal. The PCB assembly may include a package electrically connected to the component. The first differential signal may be capable of causing crosstalk onto a particular differential signal, of the second high-speed differential signal pair, while propagating through the package. The PCB assembly may include one or more sockets that are electrically connected to the package. The one or more sockets may include a socket that includes a set of pads associated with facilitating connections through the package and to the component. The set of pads may include a set of via pads and a set of grid array (GA) pads. The socket may include a first set of vias that is electrically connected to the set of via pads and that is connected to a set of layers that is perpendicular to the first set of vias. The socket may include a first set of interconnects that electrically connect the first set of vias to the set of grid array GA pads. The first set of interconnects may include a first interconnect and a second interconnect that are capable of routing the first differential signal, and the second differential signal, respectively, to offset the crosstalk that the first differential signal is capable of causing onto the particular differential signal while propagating through the package. The socket may include a second set of interconnects that electrically connect the first set of vias to a second set of vias that is to be used to facilitate routing the high-speed differential signal pairs to the component, without the high-speed differential signal pairs propagating through the PCB. The PCB assembly may include a PCB connected to the one or more sockets.

According to some possible implementations, an apparatus may include a set of pads associated with facilitating a connection through a package and to a component. The set of pads may include a set of via pads and a set of grid array (GA) pads. The apparatus may include a first set of vias that is electrically connected to the set of via pads and that is connected to a set of layers that is perpendicular to the first set of vias. The first set of vias may be used to support high-speed differential signal pairs. The high-speed differential signal pairs may be capable of causing crosstalk onto other high-speed differential signal pairs while propagating through the package. The apparatus may include a first set of interconnects that electrically connect the first set of vias to the set of GA pads. The first set of interconnects may be capable of routing the high-speed differential signal pairs in a way that offsets the crosstalk that the high-speed differential signal pairs are capable of causing while propagating through the package. The apparatus may include a second set of interconnects that electrically connect the first set of vias to a second set of vias that is to be used to facilitate routing the high-speed differential signal pairs to the component, without the high-speed differential signal pairs propagating through a printed circuit board (PCB).

BRIEF DESCRIPTION OF THE DRAWINGS

FIGS. 2A and 2B are diagrams of an example printed circuit board (PCB) assembly; and FIGS. 3A and 3B are diagrams of an example grid array (GA) pin-out pattern used as part of the example PCB assembly.

DETAILED DESCRIPTION

Figure 1A:
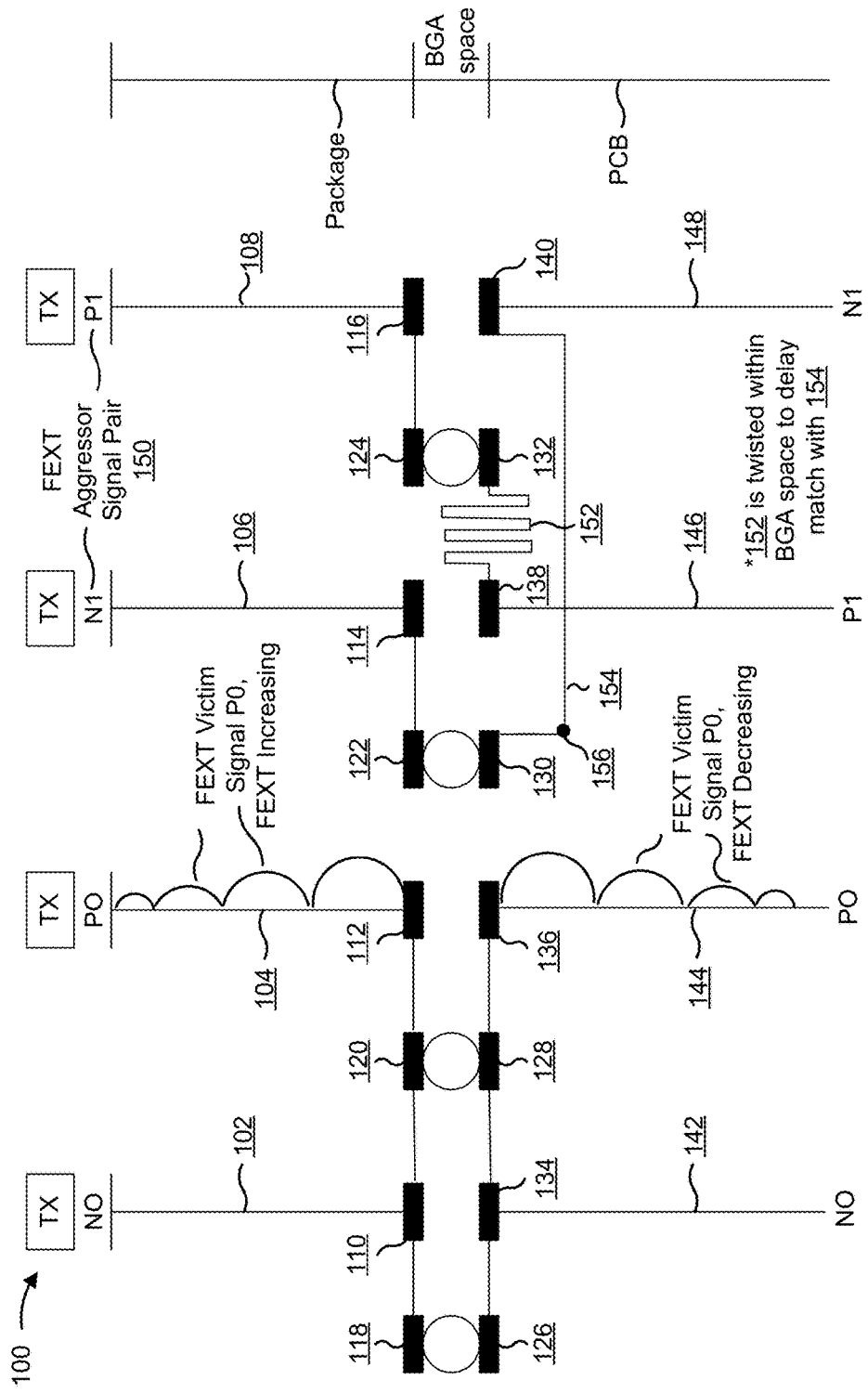
FIGS. 1A-1E are diagrams of an overview of an example apparatus described herein.

The following detailed description of example implementations refers to the accompanying drawings. The same reference numbers in different drawings may identify the same or similar elements.

A printed circuit board (PCB) assembly may include one or more components to facilitate transmitter and receiver signal routing for high speed data connections. For example, the PCB assembly may include a PCB, a package, and an integrated circuit, wherein high-speed signals travel to and from the integrated circuit by traveling through the PCB and the package. The package may include a grid array (GA), which may be, for example, a ball grid array (BGA) that includes an array of solder balls that are used to conduct electrical signals between the integrated circuit and the PCB on which the integrated circuit is placed.

The PCB may include one or more material layers that mechanically support and electrically connect electronic components using conductive pathways. The conductive pathways may be etched from copper sheets laminated onto a non-conductive substrate. The pathways may be organized as a number of layers on the PCB in order to increase the signal transmission density of the PCB.

PCBs may be used in high frequency applications. For example, a PCB may be populated with an integrated circuit used to enable high speed serial links (e.g., speeds at or above 56 gigabytes per second (Gbps))) to and from the PCB, as may be utilized for an Ethernet switch, a serializer/deserializer (SerDes), and/or the like. In this case, use of higher speed serial links may cause a significant increase in signal integrity disturbances, such as crosstalk. One type of crosstalk, far end crosstalk (FEXT), may occur when a first signal (referred to as a crosstalk aggressor signal) causes crosstalk onto a second signal (referred to as a crosstalk victim signal), wherein the signal propagation of the crosstalk aggressor signal and the crosstalk victim signal are traveling in the same direction.

In some cases, differential signaling may be used in a high speed application. For example, a differential signal pair may include two complimentary signals (e.g. a positive signal and a negative signal), and the two complimentary signals may be routed through the PCB assembly. Additionally, the differential signal pair may cause FEXT on a neighboring signal (e.g., a signal traveling within a threshold distance of the differential signal pair), in which case one of the differential signals may be a crosstalk aggressor signal and the neighboring signal may be a crosstalk victim signal.

Additionally, FEXT may be reduced by separating a distance between the crosstalk aggressor signal and the crosstalk victim signal using one or more ground vias (i.e., vias that are connected to a ground layer). For example, by adding a ground via between vias that support the crosstalk aggressor signal and the crosstalk victim signal, the signals may be far enough apart to reduce or eliminate FEXT.

However, as speeds of the serial links increase, the amount of FEXT between a crosstalk aggressor signal and a crosstalk victim signal may correspondingly increase. In this case, the distance between the crosstalk aggressor signal and the crosstalk victim signal may need to be increased to offset the increase in FEXT. One solution is to increase the number of ground vias between the vias that support the signals. Increasing the number of ground vias on the PCB reduces a number of vias available for sending and/or receiving signals, thereby reducing potential throughout of the PCB.

Some implementations described herein provide a GA space design pattern to be implemented on one or more parts of a PCB assembly to reduce or eliminate FEXT by enabling crosstalk (e.g., FEXT) cancellation. For example, a PCB assembly may include a PCB that is connected to a package, and the package may be connected to a component (e.g., an integrated circuit). In this case, the PCB assembly may be used to route high-speed differential signal pairs to and from the component.

As an example to illustrate routing through the PCB assembly, a first high-speed differential signal pair may be routed from a first part of the component (e.g., a transmitter part) to a second part of the component (e.g., a receiver part). In this example, a first differential signal of the first high-speed differential signal pair may be routed from the first part of the component, through a first package via (e.g., toward the PCB), through a GA space between the package and the PCB, through a first PCB via (e.g., toward a bottom portion of the PCB), through a non-ground layer of the PCB to a second PCB via, through the second PCB via of the PCB (e.g., toward a top portion of the PCB), through a second package via (e.g., toward the component), and may end at the second part of the component.

In some cases, the first differential signal of the first high-speed differential signal pair (referred to as a FEXT aggressor signal) may cause increasing amounts of FEXT onto a differential signal of a second high-speed differential signal pair (referred to as a FEXT victim signal). For example, the first high-speed differential signal pair may propagate through package vias at a same time and in a same direction as the second high-speed differential signal pair. Additionally, the package vias used to propagate the first differential signal pair and package vias used to propagate the second differential signal pair may be within close physical proximity of each other. As such, the FEXT aggressor signal may cause an increasing amount of FEXT onto the FEXT victim signal as the signals propagate through respective package vias.

To eliminate or reduce crosstalk such as FEXT, a GA space design pattern may be implemented on the package, on the PCB, or on a combination of the package and the PCB, to enable FEXT cancellation. For example, because the FEXT victim signal incurs an increasing amount of FEXT while propagating through the package via, a GA space design pattern may be used to cause a decreasing amount of FEXT in the PCB, such that the decrease in the amount of FEXT in the PCB offsets the increase in the amount of FEXT in the package, thereby reducing or eliminating FEXT via FEXT cancellation.

As an example, the GA space design pattern may use a first interconnect to route the FEXT aggressor signal (i.e., the first differential signal of the first high-speed differential signal) away from the FEXT victim signal and may use a second interconnect to route a second differential signal, of the first high-speed differential signal, toward the FEXT victim signal. This may cause the second differential signal to become the FEXT aggressor signal during signal propagation within the PCB, and allows for FEXT cancellation because the second high-speed differential signal has a polarity that is opposite to that of the first high-speed differential signal.

Additionally, to achieve FEXT cancellation between FEXT within the package and FEXT within the PCB, the GA space design pattern may need to delay match the first high-speed differential signal pair. The first high-speed differential signal pair may be delay matched when the first differential signal propagates at a same rate as the second differential signal, such that the two differential signals travel from a first location to a second location in approximately the same time period. To delay match the first high-speed differential signal pair, the GA space design may design the first interconnect and the second interconnect to be of lengths that ensure delay matching, where the lengths may be based on differences in package via length versus PCB via length, differences in package via diameter versus PCB via diameter, differences in velocity of propagation of signals within different layers of the package and/or PCB, and/or the like.

In this way, the GA space design pattern enables FEXT cancellation to reduce or eliminate FEXT. Additionally, the GA space design pattern improves cross-sectional bandwidth of the PCB and/or the package, increases signal density, and/or improves throughput of the PCB assembly by reducing a number of ground vias that need to be placed between vias that support actual traffic to and from the component.

Some implementations described herein provide a grid array (GA) space design pattern to be implemented within a socket of a PCB assembly to reduce or eliminate FEXT by enabling crosstalk (e.g., FEXT) cancellation. For example, a PCB assembly may include a PCB that is connected to one or more sockets, the one or more sockets may be connected to a package, and the package may be connected to a component (e.g., an integrated circuit). In this case, the PCB assembly may be used to route high-speed differential signal pairs to and from the component, without the high-speed differential signal pairs propagating through the PCB. Instead, the PCB may be used for routing all (or some) low speed differential signals, as described herein.

As an example to illustrate high-speed signal routing through the PCB assembly, a first differential signal, of a first high-speed differential signal pair, may be routed from a first part of the component (e.g., a transmitter part) to a second part of the component (e.g., a receiver part). In this example, the first differential signal may be routed from the first part of the component, through a first package via (e.g., toward the PCB), through an interconnect located within a GA space between the package and a socket, through a first socket via (e.g., toward the PCB), and through another interconnect that connects the first socket via to a second socket via. Additionally, the first differential signal may be routed through the second socket via (e.g., now in a direction toward the component), through a socket finger connected to the second package via, through a connection mechanism that is connected to the socket finger, through a cable that is connected to the connection mechanism, through a second socket (e.g., toward the component) in a similar manner described above (e.g., using socket vias and interconnects), through a second package via (e.g., toward the component), and ending at the second part of the component.

In some cases, the first differential signal of the first high-speed differential signal pair (referred to as a FEXT aggressor signal) may cause increasing amounts of FEXT onto a differential signal of a second high-speed differential signal pair (referred to as a FEXT victim signal). For example, the first high-speed differential signal pair may propagate through package vias at a same time and in a same direction as the second high-speed differential signal pair. Additionally, the package vias used to propagate the first differential signal pair and package vias used to propagate the second differential signal pair may be within close physical proximity of each other. As such, the FEXT aggressor signal may cause an increasing amount of FEXT onto the FEXT victim signal as the signals propagate through respective package vias.

To eliminate or reduce crosstalk such as FEXT, a GA space design pattern may be implemented on the socket and/or in a GA space between the socket and the package. For example, because the FEXT victim signal incurs an increasing amount of FEXT while propagating through the package via, a GA space design pattern may be used to cause a decreasing amount of FEXT in the socket, such that the decrease in the amount of FEXT in the socket offsets the increase in the amount of FEXT in the package, thereby reducing or eliminating FEXT via FEXT cancellation.

As an example, the GA space design pattern may use a first interconnect to route the FEXT aggressor signal (i.e., the first differential signal) away from the FEXT victim signal and may use a second interconnect to route the second differential signal toward the FEXT victim signal. This may cause the second differential signal to become the FEXT aggressor signal during signal propagation within the socket, and allows for FEXT cancellation because the second differential signal has a polarity that is opposite to that of the first differential signal.

Additionally, to achieve FEXT cancellation between FEXT within the package and FEXT within the socket, the GA space design pattern may need to delay match the first high-speed differential signal pair. The first high-speed differential signal pair may be delay matched when the first differential signal propagates at a same rate as the second differential signal, such that the two differential signals travel from a first location to a second location in approximately the same time period. To delay match the first high-speed differential signal pair, the GA space design pattern may use lengths for the first interconnect and the second interconnect that ensure delay matching, where the lengths may be based on differences in package via length versus socket via length, differences in package via diameter versus PCB via diameter, differences in velocity of propagation of signals within different layers of the package and/or socket, and/or the like.

In this way, the GA space design pattern enables FEXT cancellation to reduce or eliminate FEXT. Additionally, the GA space design pattern improves cross-sectional bandwidth of the PCB and/or the package by eliminating a need for ground vias, increases signal density, improves throughput of the PCB assembly, and/or the like. For example, an inferior PCB may reserve one or more ground vias between each pair of vias used to support a high-speed differential signal (e.g., to reduce crosstalk). However, this causes a number of PCB vias to be reserved for ground vias, thereby reducing a total number of vias that may be used for signal propagation of other, more relevant, signals (e.g., low-speed signals, power signals, etc.). With implementations described herein, the PCB may be designed with without ground vias that are inserted purely to reduce crosstalk of high-speed differential signals, thereby improving cross-sectional bandwidth of the PCB, signal density, throughput, and/or the like.

Figure 1B:
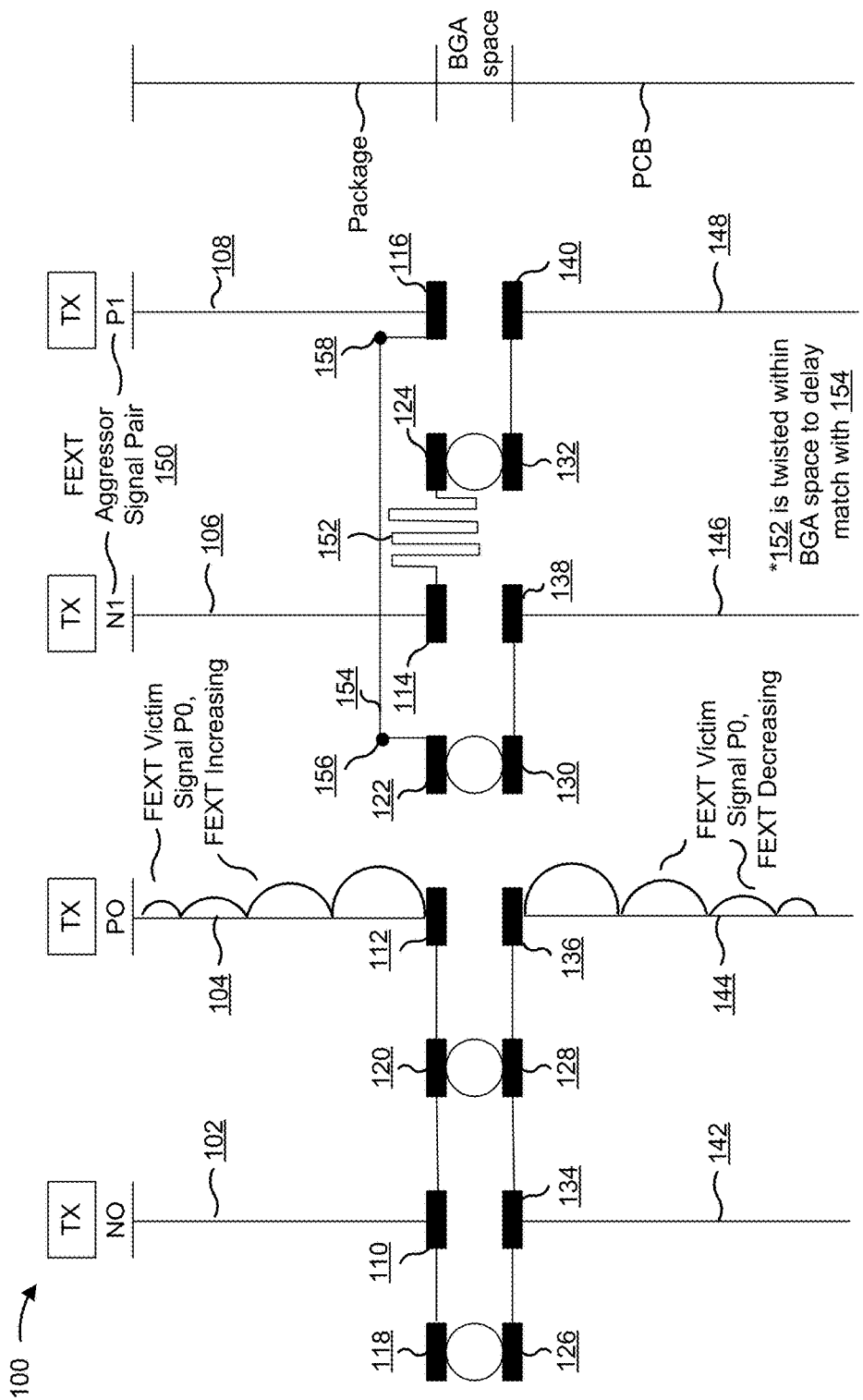
Figure 1C:
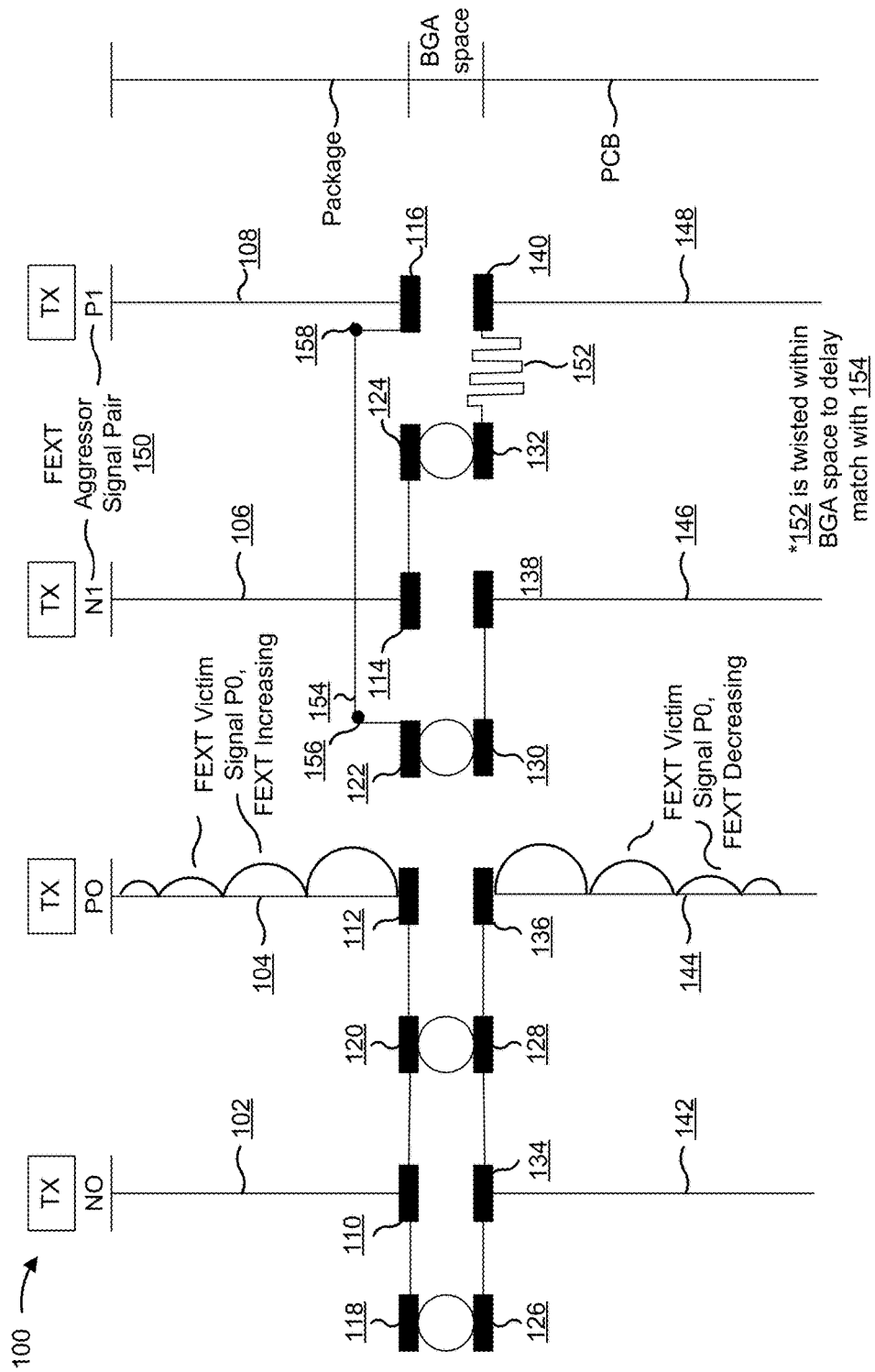
Figure 1D:
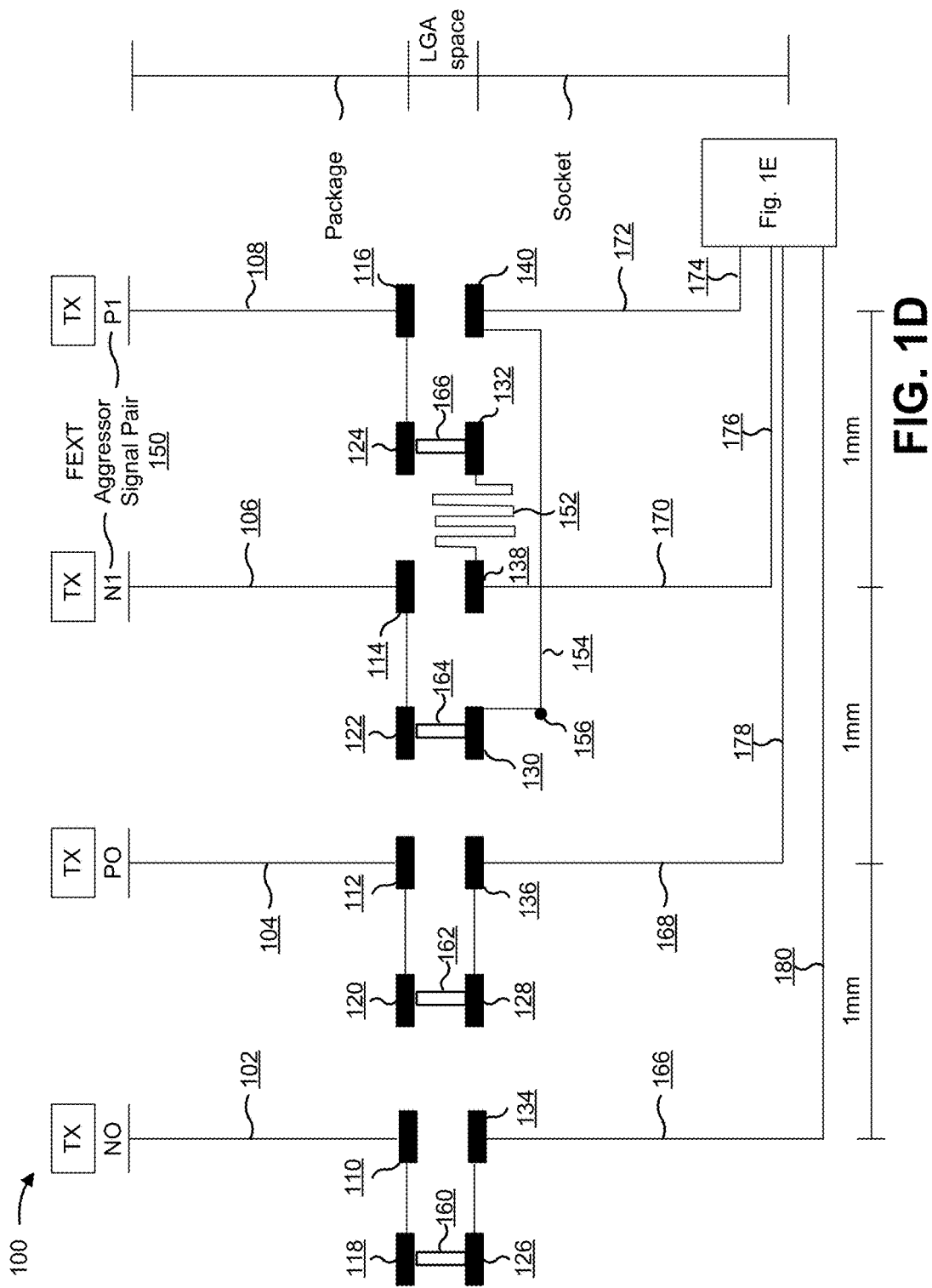
Figure 1E:
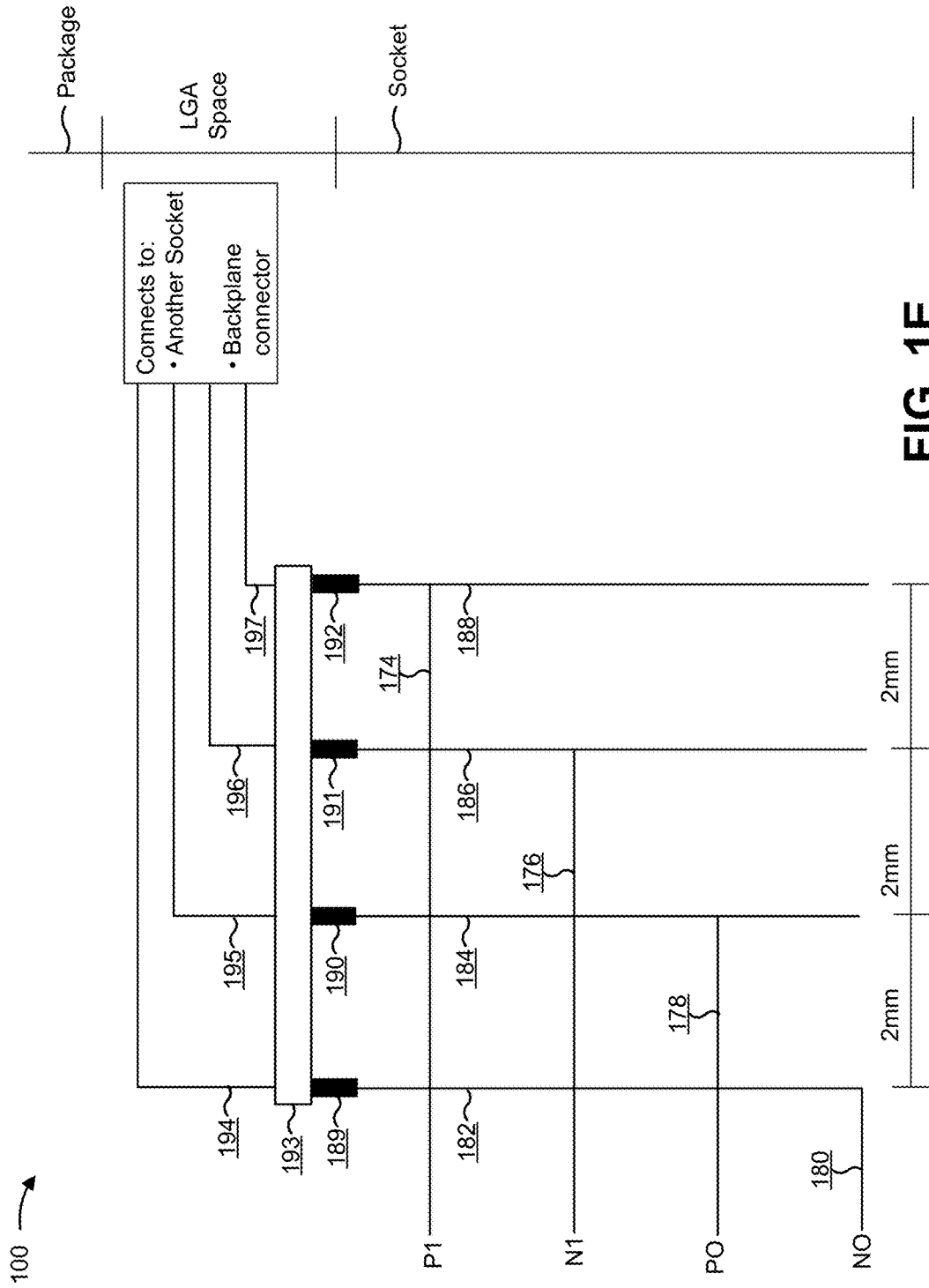

FIGS. 1A-1E are diagrams of an overview of a design pattern implemented on an example apparatus 100 described herein. FIGS. 1A-1C show a grid array (GA) space design pattern that uses a printed circuit board (PCB) and/or a package to enable FEXT cancellation (e.g., partial FEXT cancellation, complete FEXT cancellation, etc.). FIGS. 1D and 1E show a GA space design pattern that uses a socket to enable FEXT cancellation.

As shown in FIG. 1A, the GA space design pattern may be implemented on a PCB that is part of a PCB assembly. As shown in FIG. 1B, the GA space design pattern may be implemented on a package that is part of the PCB assembly. As shown in FIG. 1C, the GA space design pattern may be implemented on a combination of the PCB and the package. As shown in FIGS. 1D and 1E, the GA space design pattern may be implemented on a socket that is part of a PCB assembly.

As shown in FIG. 1A, the PCB assembly may include a package with a set of package vias (shown as package via 102, package via 104, package via 106, and package via 108) that is attached to a set of package via pads (shown as package via pad 110, package via pad 112, package via pad 114, and package via pad 116). Furthermore, the package may include a set of package grid array (GA) pads (shown as package GA pad 118, package GA pad 120, package GA pad 122, and package GA pad 124), such as a set of package ball grid array (BGA) pads, that is attached to a set of solder balls that are used to connect the package to a PCB.

Additionally, the PCB may include a set of PCB GA pads (shown as PCB GA pad 126, PCB GA pad 128, PCB GA pad 130, and PCB GA pad 132), such as a set of PCB BGA pads. Furthermore, the PCB may include a set of PCB via pads (shown as PCB via pad 134, PCB via pad 136, PCB via pad 138, and PCB via pad 140) that is attached to a set of PCB vias (shown as PCB via 142, PCB via 144, PCB via 146, and PCB via 148).

Additionally, the PCB assembly may be used to route high-speed differential signal pairs to and from a component. In some cases, high-speed differential signal pairs may serve as FEXT aggressor signal pairs and may cause crosstalk, such as FEXT, onto a differential signal of another high-speed differential signal pair.

As shown as an example, FEXT aggressor signal pair 150 may include a first FEXT aggressor signal with a negative polarity (N1) and a second FEXT aggressor signal with a positive polarity (P1). To illustrate signal propagation of the FEXT aggressor signal pair, the first FEXT aggressor signal (N1) may propagate through package via 106, through package via pad 114, through package GA pad 122, through a solder ball connected to package GA pad 122, through PCB GA pad 130, through interconnect 154 (via laser microvia 156), through PCB via pad 140, and through PCB via 148. Additionally, the second FEXT aggressor signal (P1) may propagate through package via 108, through package via pad 116, through package GA pad 124, through a solder ball connected to package GA pad 124, through PCB GA pad 132, through interconnect 152, through PCB via pad 138, and through PCB via 146.

As shown, interconnect 152 and interconnect 154 may be designed in a manner that enables FEXT cancellation. For example, even if the first FEXT aggressor signal (N1) causes increased amounts of FEXT onto the FEXT victim signal (P0) while propagating through package via 106, interconnect 154 may be designed to route the first FEXT aggressor signal (N1) away from the FEXT victim signal (P0), and interconnect 152 may be designed to route the second FEXT aggressor signal (P1) toward the FEXT victim signal. In this case, interconnect 154 may route the first FEXT aggressor signal to PCB via 148, and interconnect 152 may route the second FEXT aggressor signal to PCB via 146, thereby enabling the second FEXT aggressor signal (P1) to cause a decreasing amount of FEXT onto the FEXT victim signal (P0) while propagating through PCB via 146.

Additionally, interconnect 152 and interconnect 154 may be designed to connect PCB GA pads to PCB via pads at different layers of the PCB. For example, the PCB may include a set of layers that is perpendicular to the set of PCB vias. In this case, interconnect 152 and interconnect 154 may be designed to connect PCB GA pads to PCB via pads at different layers to avoid causing a short circuit. This is illustrated by interconnect 152 connecting PCB GA pad 132 to PCB via pad 138 at a first layer (e.g., layer 1 of the PCB) and by interconnect 154 connecting PCB GA pad 130 to PCB via pad 140 at another layer (e.g., layer 3 of the PCB).

Additionally, to connect interconnect 154 from PCB GA pad 130 to PCB via pad 140 through the other layer, interconnect 154 may have to traverse through one or more microvias (shown as laser microvia 156). In this way, interconnect 152 and interconnect 154 enable FEXT cancellation without risk of FEXT aggressor signal pair 150 causing a short circuit.

In some implementations, to ensure that an accurate amount of FEXT cancellation occurs, the GA space design pattern may include lengths for interconnect 152 and/or interconnect 154 that ensure that the FEXT aggressor signals are delay matched. For example, assume a time needed for the FEXT aggressor signals to propagate through package vias is equal to a time needed for the FEXT aggressor signals to propagate through PCB vias. In this case, a length of interconnect 152 and a length of interconnect 154 may ensure proper delay matching by being equal.

In some cases, the GA space design pattern may include lengths for interconnect 152 and/or interconnect 154 that are based on a number of different factors that influence delay matching. For example, the GA space design pattern may include lengths of interconnect 152 and interconnect 154 that offset a difference in a total distance that the first FEXT aggressor signal (N1) and the second FEXT aggressor signal (P1) propagate through the package in relation to a total distance that the first FEXT aggressor signal (N1) and the second FEXT aggressor signal (P1) propagate through the PCB.

As an example, assume PCB via 146 and PCB via 148 are longer than package via 106 and package via 108. If interconnect 152 and interconnect 154 were of equal length, the second FEXT aggressor signal would travel through PCB via 146 for a longer distance than the first FEXT aggressor signal would travel through package via 106. This would cause the decreases in FEXT from the second FEXT aggressor signal to exceed the FEXT increases caused by first FEXT aggressor signal (which may cause FEXT in an opposite direction). Instead, the GA space design pattern may include a length of interconnect 152 that is longer than a length of interconnect 154, thereby ensuring that the FEXT aggressor signal pair is delay matched.

Additionally, or alternatively, the GA space design pattern may include lengths of interconnect 152 and interconnect 154 that offset a difference between package via diameter and PCB via diameter. For example, if package vias and PCB vias have different diameters, FEXT aggressor signals traveling through the package vias and the PCB vias may have different velocity of propagation speeds. As an example, if package vias have larger diameters than PCB vias, and interconnect 152 and interconnect 154 are of equal length, the FEXT aggressor signal pairs may not delay match. Instead, either interconnect 152 or interconnect 154 may be designed to be longer than the other to offset a difference between package via diameter and PCB via diameter.

Additionally, or alternatively, the GA space design pattern may include lengths of interconnect 152 and interconnect 154 that offset a difference in a velocity of propagation of FEXT aggressor signals while propagating through interconnect 152 and interconnect 154. For example, different layers of the PCB may use different transmission lines (e.g., microstrip, stripline, and/or the like) that have different velocities of propagation. Because interconnect 152 and interconnect 154 are located at different layers to prevent a short circuit, the differential signals propagating through interconnect 152 and interconnect 154 may propagate at different velocities. To offset this, the GA space design pattern may include interconnect 152 and interconnect 154 such that an interconnect located at a layer with a faster velocity of propagation is longer than an interconnect located at a layer with a slower velocity of propagation.

In some implementations, the PCB assembly may be designed with one or more ground vias between the FEXT aggressor signal pair and the FEXT victim signal. For example, depending on a differential signal speed (e.g., 56 gigabytes per second (Gbps), 112 Gbps, etc.), ground vias may need to be implemented in addition to the above-described GA space design pattern to ensure that FEXT is reduced or eliminated. However, it is to be noted that a number of ground vias that would be used in conjunction with the GA space design pattern will always be less than a number of ground vias that would be used if the GA space design pattern was not implemented, thereby improving cross-sectional bandwidth of the PCB and/or the package relative to a conventional architecture of a PCB assembly (e.g., that does not utilize the GA space design pattern).

By designing interconnect 154 to route the first FEXT aggressor signal away from the FEXT victim signal, by designing interconnect 152 to route the second FEXT aggressor signal toward the FEXT victim signal, and by designing interconnect 152 and interconnect 154 in a manner that delay matches the FEXT aggressor signals, the GA space design pattern is able to enable FEXT cancellation. Furthermore, enabling FEXT cancellation reduces a number of ground vias that need to be placed between vias that support actual traffic to and from the component, thereby improving cross-sectional bandwidth of the PCB and/or the package, increasing signal density, improving throughput of the PCB assembly, and/or the like.

As shown in FIG. 1B, the GA space design pattern may be implemented on the package. For example, rather than place interconnect 152 and interconnect 154 within the PCB (as shown in FIG. 1A), the GA space design pattern may be implemented on the package.

To illustrate signal propagation of the FEXT aggressor signal pair, the first FEXT aggressor signal (N1) may propagate through package via 106, through package via pad 114, through interconnect 152, through package GA pad 124 (e.g., which may be a ball grid array (BGA) pad), through a solder ball connected to package GA pad 124, through PCB GA pad 132 (e.g., which may be a BGA pad), through PCB via pad 140, and through PCB via 148. Additionally, the second FEXT aggressor signal (P1) may propagate through package via 108, through package via pad 116, through interconnect 154 (via laser microvia 158 and laser microvia 156), through package GA pad 122, through a solder ball that connects to package GA pad 122, through PCB GA pad 130, through PCB via pad 138, and through PCB via 146.

As shown, the GA space design pattern may include a structure for interconnect 152 and interconnect 154 that enables FEXT cancellation, in a same manner described above. Additionally, the GA space design pattern may include lengths for interconnect 152 and interconnect 154 that are based on a number of different factors that influence delay matching, as each described above.

In this way, the GA space design pattern may enable FEXT cancellation. Furthermore, enabling FEXT cancellation reduces a number of ground vias that need to be placed between vias that support actual traffic to and from the component, thereby improving cross-sectional bandwidth of the package and/or the PCB, increasing signal density, improving throughput of the PCB assembly, and/or the like.

As shown in FIG. 1C, the GA space design pattern may be implemented on a combination of the PCB and the package. For example, rather than place interconnect 152 and interconnect 154 on the PCB, or rather than place interconnect 152 and interconnect 154 on the package, the GA design pattern may be implemented to place either interconnect 152 or interconnect 154 on the PCB and either interconnect 154 or interconnect 152 on the package.

In some cases, as shown, interconnect 152 may be implemented on the package and interconnect 154 may be implemented on the PCB. To illustrate signal propagation of the FEXT aggressor signal pair, the first FEXT aggressor signal (N1) may propagate through package via 106, through package via pad 114, through package GA pad 124 (e.g., a ball grid array (BGA) pad), through a solder ball connected to package GA pad 124, through PCB GA pad 132 (e.g., a BGA pad), through interconnect 152, through PCB via pad 140, and through PCB via 148. Additionally, the second FEXT aggressor signal (P1) may propagate through package via 108, through package via pad 116, through interconnect 154, through package GA pad 122, through a solder ball connected to package GA pad 122, through PCB GA pad 130, through PCB via pad 138, and through PCB via 146. In other cases, interconnect 152 may be implemented on the PCB and interconnect 154 may be implemented on the package, and signal propagation may occur in a similar manner.

As shown, the GA space design pattern may include a structure for interconnect 152 and interconnect 154 that enables FEXT cancellation, in a similar manner as described above. Additionally, the GA space design pattern may include lengths for interconnect 152 and interconnect 154 that are based on a number of different factors that influence delay matching, as each described above.

In this way, the GA space design pattern may enable FEXT cancellation. Furthermore, enabling FEXT cancellation reduces a number of ground vias that need to be placed between vias that support actual traffic to and from the component, thereby improving cross-sectional bandwidth of the package and/or the PCB, increasing signal density, improving throughput of the PCB assembly, and/or the like.

As shown in FIG. 1D, a GA space design pattern may be implemented on a socket. For example, rather than place interconnect 152 and interconnect 154 within PCB or the package (as shown in FIGS. 1A-C), the GA space design pattern may be implemented on the socket.

To illustrate signal propagation of the FEXT aggressor signal pair, the first FEXT aggressor signal (N1) may propagate through package via 106, through package via pad 114, through interconnect 152, through package GA pad 123, through socket beam 164 (which may be part of a set of socket beams, as shown by socket beam 160, socket beam 162, socket beam 164, and socket beam 166), through a first socket GA pad 130 (e.g., which may be a land grid array (LGA) pad), through interconnect 154 (e.g., using microvia 156), through a second socket GA pad (e.g., a LGA pad), through socket via 170, and through interconnect 174 (to be routed to another socket, or to a backplane connector, as shown in FIG. 1E, as described below). Additionally, the second FEXT aggressor signal (P1) may propagate through package via 108, through package via pad 116, through a GA package pad 124, through socket beam 166, through GA socket pad 132, through interconnect 152, through socket via pad 138, through socket via 170, and through interconnect 176 (to be routed to the other socket, or to the backplane connector, as shown in FIG. 1E, as described below).

As shown, the GA space design pattern may include a structure for interconnect 152 and interconnect 154 that enables FEXT cancellation, in a same manner described above. Additionally, the GA space design pattern may include lengths for interconnect 152 and interconnect 154 that are based on a number of different factors that influence delay matching, as each described above.

In some cases, the GA space design pattern may dedicate particular socket vias, of a first set of socket vias (e.g., socket via 166, socket via 168, socket via 170, socket via 172, etc.), to particular types of high-speed differential signals. For example, the first set of socket vias may include a first subset of socket vias that are similar in length to corresponding package vias (e.g., package via 102, package via 104, package via 106, package via 108, etc.), and may include a second subset of socket vias that are much smaller in length than corresponding package vias.

In this case, the GA space design pattern may dedicate the first subset of socket vias to supporting differential signal pairs with low signal-to-noise (SNR) ratios (e.g., traces moving across fabric, etc.), and may dedicate the second subset of socket vias to supporting differential signal pairs with high signal-to-noise (SNR) ratios (e.g., wide area network (WAN) signals, etc.). By dedicating socket vias that are shorter in length to high-speed signals with high SNR ratios, the high SNR ratio signals will have less time to cause FEXT than high-speed signals with low SNR ratios, but may cause FEXT at a faster rate as a result of the higher speeds. By dedicating socket vias that are longer in length to high-speed signals with low SNR ratios, the low SNR ratio signals will have more time to cause FEXT than the high-speed signals with high SNR ratios, but may cause FEXT at a slower rate as a result of the lower speeds.

In some cases, the above mentioned implementation may be supported using thresholds. For example, the GA space design pattern may consider whether particular socket via lengths satisfy particular threshold levels of similarity with particular package via lengths. In this way, the GA space design pattern is able to take the type of differential signal into account when selecting which socket vias to use for which differential signals, which may improve delay matching accuracy of different types of differential signals.

In this way, the GA space design pattern may enable FEXT cancellation.

As shown in FIG. 1E, rather than route the first differential signal pair and the second differential signal pair through the PCB (as shown in FIGS. 1A-1C), the GA space design pattern may route the first differential signal pair and the second differential signal pair to another socket or to a backplane connection. In this case, while not shown, the first differential signal pair and the second differential signal pair may be routed, through the other socket or the backplane connection (e.g., in a direction toward the component), through the package (e.g., in the direction toward the component), and to the component (e.g., to a receiver part of the component).

As shown, the socket may route the first differential signal pair and the second differential signal pair through additional components not previously utilized with respect to FIGS. 1A-1C. For example, the socket may include a second set of interconnects (shown as interconnect 174, interconnect 176, interconnect 178, and interconnect 180), a second set of socket vias (shown as socket via 182, socket via 184, socket via 186, and socket via 188), a set of socket fingers (shown as socket finger 189, socket finger 190, socket finger 191, and socket finger 193), a connection mechanism 193, a set of cables (shown as cable 194, cable 195, cable 196, and cable 197), and the other socket or to the backplane connector.

To illustrate the signal propagation, the FEXT aggressor signal pair 150 may and the FEXT victim signal pair may propagate through the second set of interconnects (interconnect 174, interconnect 176, interconnect 178, and interconnect 180). For example, FEXT aggressor signal pair 150 (shown as N1 and P1) may propagate through interconnect 174 and interconnect 176, and the FEXT victim signal pair (shown as N0 and P0) may propagate through interconnect 178 and interconnect 180. In this case, the FEXT aggressor signal pair 150 and the FEXT victim signal pair may propagate through the second set of socket vias (shown as socket via 182, socket via 184, socket via 186, and socket via 188), through the set of socket fingers (shown as socket finger 189, socket finger 190, socket finger 191, and socket finger 193), through connection mechanism 193, through the set of cables (shown as cable 194, cable 195, cable 196, and cable 197), and though the other socket or the backplane connector. Furthermore, the FEXT aggressor signal pair 150 and the FEXT victim signal pair may be routed through the other socket or the backplane connect, back through the package, and to the component (e.g., to a receiver part of the component).

Additionally, the second set of socket vias (e.g., socket via 182, socket via 184, socket via 186, and socket via 188) may be spaced such that differential signals propagating through do not cause FEXT onto each other. For example, each socket via, of the second set of socket vias, may have a two millimeter spacing to ensure that differential signals traveling through the socket vias do not cause FEXT onto each other. Furthermore, a particular socket via, of the second set of socket vias, that is closest to the first set of socket vias, may also have a two millimeter spacing between the particular socket via and the closest socket via of the first set of socket vias (e.g., to ensure that differential signals do not cause FEXT onto the particular socket via). It is to be noted that the first set of socket vias are spaced such that differential signals propagating through the first set of socket vias can cause FEXT onto each (see, e.g., FIG. 1D illustration showing a one millimeter spacing between socket vias). This closer spacing between the first set of socket vias is what allows FEXT cancellation between the package and the socket to be achieved.

In this way, the GA space design pattern enables FEXT cancellation to reduce or eliminate FEXT. Additionally, the GA space design pattern improves cross-sectional bandwidth of the PCB and/or the package by eliminating a need for ground vias, increases signal density, improves throughput of the PCB assembly, and/or the like.

As indicated above, FIGS. 1A-1E are provided merely as an example. Other examples are possible and may differ from what was described with regard to FIGS. 1A-1E. For example, there may be additional elements of apparatus 100, fewer elements of apparatus 100, different elements of apparatus 100, or differently arranged elements of apparatus 100 than those shown in FIGS. 1A-1E. An element may be a via, a pad, a solder ball, a solder bump, and/or any other hardware included within the package, the socket, and/or the PCB. Furthermore, two or more elements shown in FIGS. 1A-1E may be implemented within a single element, or a single element shown in FIGS. 1A-1E may be implemented as multiple, distributed elements. Additionally, or alternatively, elements of example apparatus 100 may perform one or more functions described as being performed by other elements of example apparatus 100.

Figure 2A:
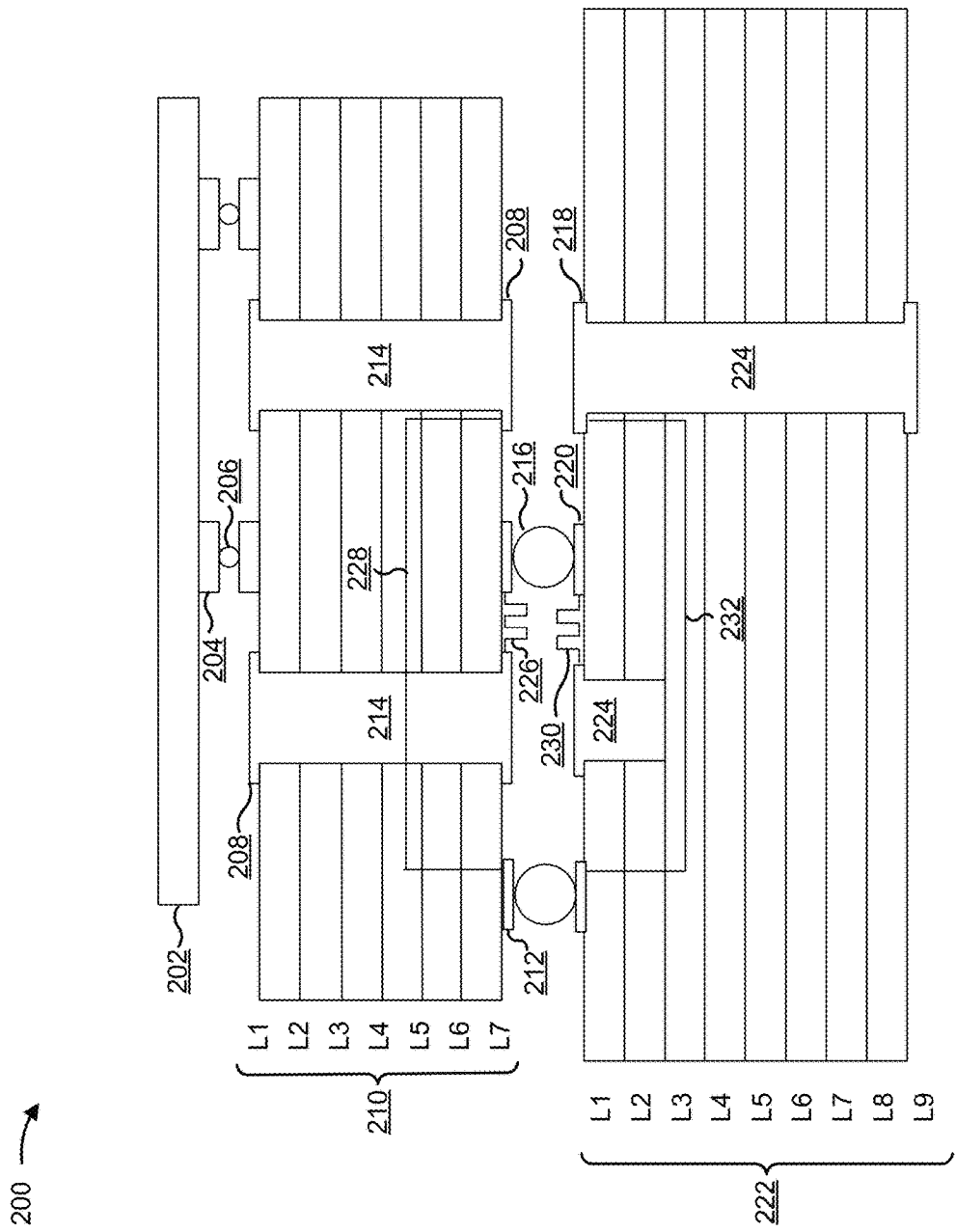

FIGS. 2A and 2B are diagrams of an example apparatus 200 that includes one or more components of a printed circuit board (PCB) assembly. For example, FIG. 2A is a diagram of an example apparatus 200 that includes a component 202, a set of component pads 204, a set of solder bumps 206, a set of package via pads 208, a package 210, a set of package grid array (GA) pads 212 (e.g., package ball grid array (BGA) pads, package land grid array (LGA) pads, and/or the like), a set of package vias 214, a set of solder balls 216, a set of PCB via pads 218, a set of PCB GA pads 220 (e.g., PCB BGA pads, PCB LGA pads, and/or the like), a PCB 222, a set of PCB vias 224, a set of interconnects (e.g., interconnect 226, interconnect 228, interconnect, 230, interconnect 232, and/or the like), and/or the like.

In some implementations, component 202 may include a serializer/deserializer (SerDes) application-specific integrated circuit (ASIC), a field programmable gate array (FPGA), a bus, a power supply, an integrated circuit, an optical module, and/or the like.

In some implementations, package 210 may include a substrate (e.g., a non-conductive substrate) that includes mechanical support for component 202. In some implementations, PCB 222 may include a substrate that includes mechanical support for package 210. Additionally, or alternatively, package 210 and/or PCB 222 may include electrical connections for component 202 using, for example, component pads 204, package via pads 208, package GA pads 212, package vias 214, solder balls 216, PCB via pads 218, PCB GA pads 220, and/or PCB vias 224, conductive traces, and/or other features etched from laminated sheets (e.g., copper sheets or sheets made from another conductive material).

In some implementations, package 210 may include multiple layers, and conductors on different layers may be connected with package vias 214. In some implementations, PCB 222 may include multiple layers, and conductors on different layers may be connected with PCB vias 224.

In some implementations, package via 214 may provide an electrical connection between different layers and/or surfaces of package 210. For example, package via 214 may include a hole, in package 210, that is plated with a conductive material to provide the electrical connection. While FIG. 2 depicts two package vias 214 of the same length, it is to be understood that other implementations include package vias 214 that extend to particular layers of package 210 and/or include different lengths. In some implementations, PCB via 224 may provide an electrical connection between different layers and/or surfaces of PCB 222. For example, PCB via 224 may include a hole, in PCB 222, that is plated with a conductive material to provide the electrical connection.

In some implementations, package vias 214 and/or PCB vias 224 may serve as, for example, a transmitter (TX) via, a receiver (RX) via, and/or a ground via, as described below. A TX via may serve as a package via 214 and/or a PCB via 224 used for transmission of a signal output by component 202. In some implementations, package 210 and/or PCB 222 may include a pair of TX vias used to carry a differential signal pair (e.g., a positive signal and a negative signal) transmitted by component 202 (e.g., for differential signaling). In some implementations, an RX via may serve as a package via 214 and/or a PCB via 224 used for reception of a signal to be received by component 202. In some implementations, package 210 and/or PCB 222 may include a pair of RX vias used to carry a differential signal pair to be received by component 202. In some implementations, a ground via may serve as a package via 214 and/or a PCB via 224 used for electrical grounding of component 202. In some implementations, a ground via may be used to carry a ground signal to component 202, may be used to provide a ground connection for power, and/or the like.

In some cases, PCB 222 may support multiple packages 210 and/or multiple components 202. For example, PCB 222 may connect to multiple packages 210 and/or multiple components 202 to allow signals to be routed from one component 202 to one or more additional components 202. As an example, a transmitter signal (or transmitter signals in the case of a differential signal pair) may be routed from a first component 202, through a package via 214 of a first package 210, through a first PCB via 224 (which may extend one or more layers below a first layer), through a layer connected to a bottom portion of the first PCB via 224, to one or more additional PCB vias 224. Additionally, the transmitter signal may be routed upward through another PCB via 224 (e.g., a PCB via 224 that may be used to reach a second component 202), through a package via 214 of a second package 210, and to the second component 202. In other cases, a package 210 may support multiple components 202.

In some implementations, package via 214 and/or PCB via 224 may include, at each layer of package 210 and/or PCB 222, a pad that provides electrical connections between copper traces on the layer or an anti-pad that defines a non-conductive "void" around the package via 214 and/or PCB via 224 to insulate the package via 214 and/or PCB via 224 from that layer.

A number of example layers are shown in association with package 210 (e.g., "L1-L7") and in association with PCB 222 (e.g., "L1-L9"). Each layer may include conductive traces (e.g., copper traces) that route power, signal, and/or ground communication paths through package 210 and/or PCB 222. Each layer may be generally electrically isolated from one another, and may be potentially connected through package vias 214 or PCB vias 224. In some implementations, a layer may be a power layer or a ground layer. For example, PCB 222 may include an alternating pattern of ground layers and power layers.

In some implementations, and as shown in FIG. 2, PCB vias 224 may extend to different layers of PCB 222. For example, as shown in FIG. 2, a first via 224 may extend from a first layer (e.g., "L1") to a second layer (e.g., "L3"), and a second via may extend from the first layer (e.g., "L1") to a ninth layer (e.g., "L9").

In some implementations, different package vias 214 and/or PCB vias 224 may be different types of vias. For example, package via 214 and/or PCB via 224 may be a laser drilled microvia, a short plated-through hole via, a stacked microvia, a skip via, and/or the like. In some implementations, particular fabrication techniques may be used to extend a package via 214 to a particular layer of package 210 and/or a PCB via 224 to a particular layer of PCB 222 (e.g., a backdrilling technique, a stacking technique, etc.).

In some implementations, solder ball 216 may include a mounting mechanism for mounting package 210 to PCB 222. Additionally, or alternatively, solder bump 206 may include a mounting mechanism for mounting component 202 to package 210. In some implementations, package 210 may be mounted to the PCB 222 using the set of solder balls 216 (e.g., by heating the set of solder balls 216 and causing the set of solder balls 216 to melt). In some implementations, the set of solder balls 216 may be arranged in a grid array (GA). In this case, multiple PCB vias 224 may be arranged in an array (e.g., an array of PCB vias 224) according to the GA pattern of solder balls 216 (e.g., to provide electrical connectivity for package 210 mounted to PCB 222).

A set of solder balls 216 is an example of a mounting mechanism that may be used to mount package 210 to PCB 222. Additionally, a set of solder bumps 206 is an example of a mounting mechanism that may be used to mount component 202 to package 210.

In some implementations, other mounting mechanisms may be used, such as a surface-mount technology (SMT) mechanism (e.g., one or more pins, a pin grid array, one or more leads, one or more flat contacts, and/or the like), a through-hole technology (e.g., one or more leads on the integrated circuit may be inserted into PCB vias 224), and/or the like.

In some implementations, a set of interconnects may be used as part of a GA space design pattern. For example, interconnect 226 and interconnect 228 may be used as part of a GA space design pattern that is located within package 210 and enables FEXT cancellation between package 210 and PCB 222, as described elsewhere herein. As another example, interconnect 230 and interconnect 232 may be used as part of GA space design pattern that is located within PCB 222 and enables FEXT cancellation between package 210 and PCB 222, as described elsewhere herein. As another example, a combination of interconnects (e.g., interconnect 226 and interconnect 232, interconnect 230 and interconnect 228, etc.) may be used as part of a GA space design pattern that is located both in package 210 and PCB 222 and enables FEXT cancellation between package 210 and PCB 222, as described elsewhere herein.

While FIG. 2A includes a particular number of package vias 214 and/or PCB vias 224, it should be understood that other implementations include different numbers of package vias 214 and/or PCB vias 224 that extend to and/or from different layers of package 210 and/or PCB 222. Additionally, while FIG. 2A includes an example of a particular layout of interconnects, it is to be understood that in other examples, a layout of interconnects may be of different sizes, have different physical locations, have a different number of interconnects, be located entirely in the package, be located entirely in the PCB, be located in both the package and the PCB, and/or the like.

FIG. 2B is a diagram of an example apparatus 200 that includes a component 202, a set of component pads 204, a set of solder bumps 206, a set of package via pads 208, a package 210, a set of package vias 214, a set of solder balls 216, a set of PCB via pads 218, a set of PCB GA pads 220, a PCB 222, a set of PCB vias 224, a set of package grid array (GA) pads 234 (e.g., package ball grid array (BGA) pads, package land grid array (LGA) pads, and/or the like), a set of socket beams 236, a set of socket GA pads 238 (e.g., socket ball grid array (BGA) pads, socket land grid array (LGA) pads, and/or the like), a set of socket via pads 240, a socket 242, a set of socket vias 244, a first set of socket vias (e.g., socket via 244), a first set of interconnects (shown as interconnect 246 and interconnect 248), a second set of interconnects (shown as interconnect 250 and interconnect 252), a second set of socket vias (e.g., socket via 254), a set of socket fingers 256, one or more connection mechanisms 258, a set of cables 260, and/or a connecting object 262 (e.g., another socket, a backplane connector, etc.).

In some implementations, socket 242 may include one or more components described in association with package 210 and/or PCB 222. For example, socket 242 may include a substrate (e.g., a non-conductive substrate) that includes mechanical support for component 202, package 210, and/or PCB 222. Additionally, or alternatively, socket 242 may include electrical connections for component 202, using, for example, socket beam 236, socket GA pad 238, socket via pad 240, socket via 244, interconnect 248, interconnect 250, interconnect 252, conductive traces, and/or other feature etched from laminated sheets.

In some implementations, socket 242 may include multiple layers, and conductors on different layers may be connected with socket vias 244 and/or socket vias 254. In some implementations, socket vias 244 and/or socket vias 254 may provide an electrical connection between different layers and/or surfaces of socket 242. For example, a socket via 244 or a socket via 254 may include a hole, in socket 242, that is plated with a conductive material to provide the electrical connection. While FIG. 2B depicts a certain number of socket vias of particular lengths, it is to be understood that other implementations include socket vias 244 and/or socket vias 254 that include other lengths.

In some implementations, socket vias 244 and/or socket vias 254 may serve as, for example, a transmitter (TX) via, a receiver (RX) via, and/or a ground via, as described below. A TX via may serve as a socket via 244 and/or a socket via 254 used for transmission of a signal output by component 202. In some implementations, socket 242 may include a pair of TX vias used to carry a differential signal pair (e.g., a positive signal and a negative signal) transmitted by component 202 (e.g., for differential signaling). In some implementations, an RX via may serve as a socket via 244 and/or a socket via 254 used for reception of a signal to be received by component 202. In some implementations, socket 242 may include a pair of RX vias used to carry a differential signal pair to be received by component 202. In some implementations, a ground via may serve as a socket via 244 and/or a socket via 254 used for electrical grounding of component 202. In some implementations, a ground via may be used to carry a ground signal to component 202, may be used to provide a ground connection for power, and/or the like.

In some cases, PCB 222 may support multiple sockets 242, multiple packages 210, and/or multiple components 202. For example, PCB 222 may connect to multiple sockets 242, multiple packages 210, and/or multiple components 202 to allow signals to be routed from one component 202 to one or more additional components 202. As an example, a transmitter signal (or transmitter signals in the case of a differential signal pair) may be routed from a first component 202, through a package via 214 of a first package 210, through a first socket via 244 (which may extend one or more layers below a first layer), through an interconnect (e.g., interconnect 250, interconnect 252, etc.), through a second socket via 254, through a socket finger 256, through a connection mechanism 258, through a cable 260, through an object 262 (e.g., another socket), and then through the object 262 to a second package via 214 of a second package 210, and to a second component 202.

In some implementations, socket via 244 and/or socket via 254 may include, at each layer of socket 242, a pad that provides electrical connections between copper traces on the layer or an anti-pad that defines a non-conductive "void" around the socket via 244 and/or socket via 254 to insulate the socket via 244 and/or socket via 254 from that layer.

A number of example layers are shown in association with package 210 (e.g., "L1-L4") and in association with socket 242. Each layer may include conductive traces (e.g., copper traces) that route power, signal, and/or ground communication paths through socket 242. Each layer may be generally electrically isolated from one another, and may be potentially connected through socket via 244 and/or socket via 254. In some implementations, a layer may be a power layer or a ground layer. For example, socket 242 may include an alternating pattern of ground layers and power layers.

In some implementations, different socket vias 244 and/or socket vias 254 may be different types of vias. For example, socket via 244 and/or socket via 254 may be a laser drilled microvia, a short plated-through hole via, a stacked microvia, a skip via, and/or the like. In some implementations, particular fabrication techniques may be used to extend a socket via 244 and/or socket via 254 to a particular layer of package socket 242 (e.g., a backdrilling technique, a stacking technique, etc.).

In some implementations, socket 242 and package 210 may be connected using a GA space. For example, socket 242 and package 210 may be connected using a GA space that includes package GA pads 234, socket GA pads 238, and socket beams 236. In this case, socket beam 236 may be a conductive piece of metal that is able to allow socket 242 and package 210 to form an electrical connection. In some implementations, other mounting mechanisms may be used, such as a grid array (GA) (e.g., using the set of solder balls 216), a surface-mount technology (SMT) mechanism (e.g., one or more pins, a pin grid array, one or more leads, one or more flat contacts, and/or the like), a through-hole technology (e.g., one or more leads on the integrated circuit may be inserted into PCB vias 224), and/or the like.

In some implementations, a first set of interconnects (e.g., interconnect 246, interconnect 248) may be used as part of a GA space design pattern. For example, interconnect 246 and interconnect 248 may be used as part of a GA space design pattern that is located within package 210 and enables FEXT cancellation between package 210 and socket 242, as described elsewhere herein.

In some implementations, a second set of interconnects (e.g., interconnect 250, interconnect 252, etc.) may be used as part of the GA space design pattern. For example, a second set of interconnects may be used to route the high-speed differential signals away from PCB 222 and toward another object 262 (e.g., another socket 242).

In some implementations, socket vias 242 may be used as part of the GA space design pattern. For example, socket vias 242 may connect to the second set of interconnects to continue to route the high-speed differential signals away from PCB 222. In some cases, socket vias 242 may be spaced such that high-speed differential signals propagating through socket vias 242 are unable to cause crosstalk onto each other.

In some implementations, socket vias 242 may connect to a set of socket fingers 256. For example, the set of socket fingers 256 may include one or more pieces of compressed metal that are able to connect socket vias 242 to a connection mechanism 258. The connection mechanism 258 may be attachable to a group of socket fingers 256 (e.g., all socket fingers 256, a subset of socket fingers 256, etc.), and may also connect to the set of cables 260. In some implementations, the set of cables 260 may connect to another object 262, such as another socket, a backplane connector, and/or the like.

In this way, high-speed differential signals are able to be routed away from PCB 222, such that an entire cross-section of PCB 22 may be utilized, thereby maximizing throughput, signal density, cross-sectional bandwidth, and/or the like.

Figure 3A:
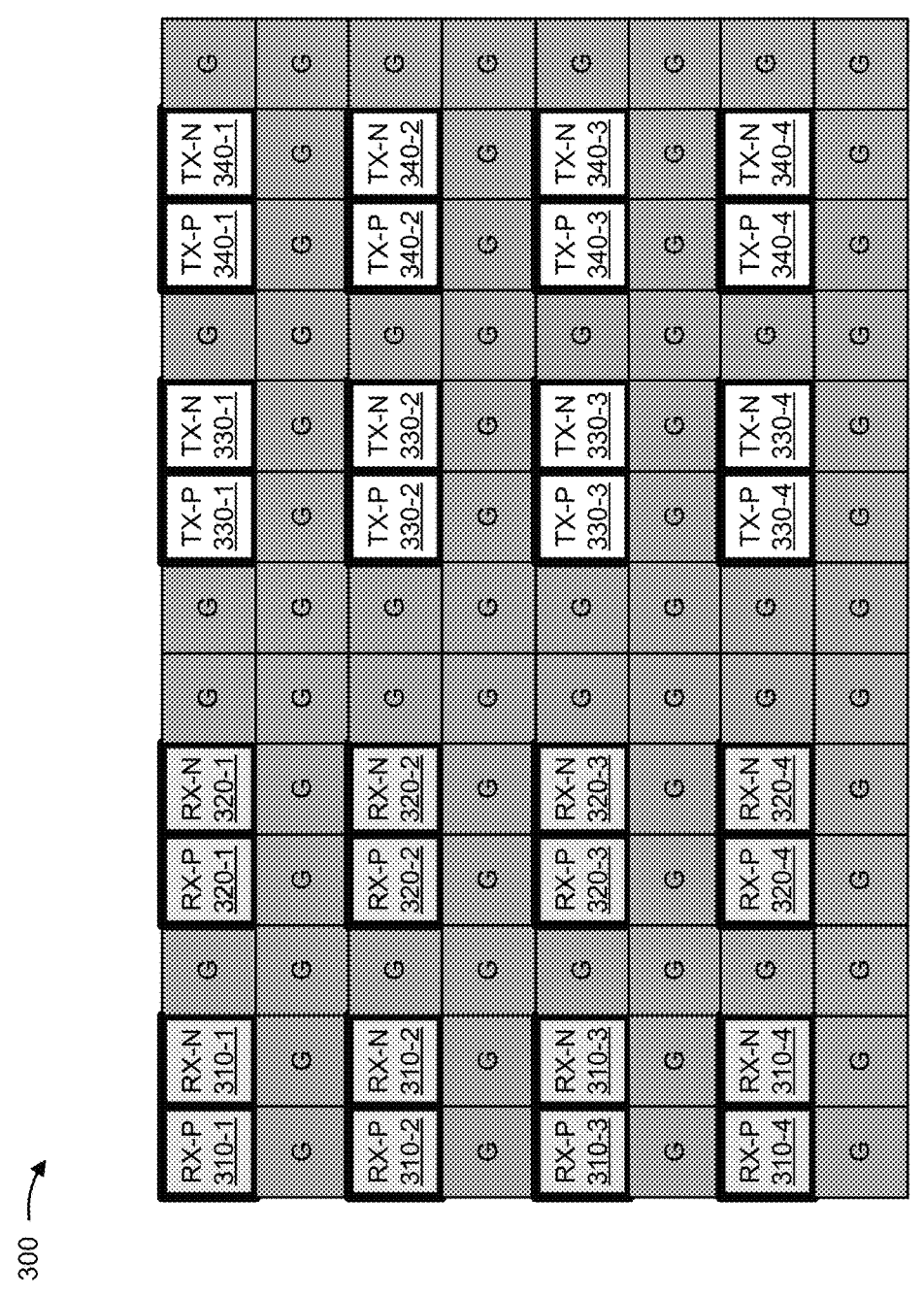
Figure 3B:
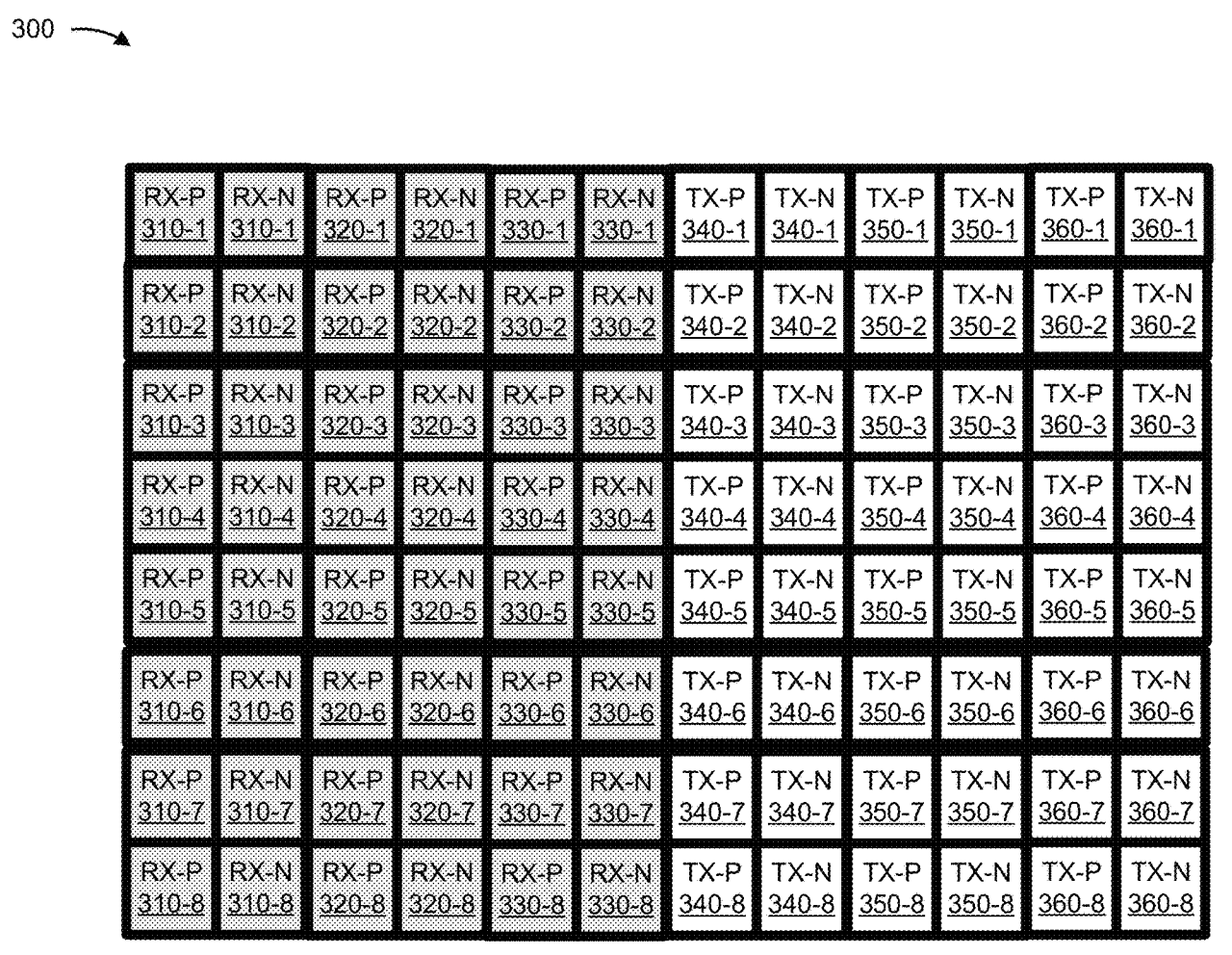

FIGS. 3A and 3B are diagrams of example implementation 300 which depicts a GA pin-out pattern. As shown in FIGS. 3A and 3B, the example GA pin-out pattern may enable package 210 to mount to PCB 222 (e.g., to provide electrical connectivity for package 210 mounted to PCB 222 using solder balls 216). In other words, the example GA pin-out pattern shown in FIGS. 3A and 3B may correspond to a pattern of an array of PCB vias 224 of PCB 222. Additionally, or alternatively, the example GA pin-out pattern shown in FIGS. 3A and 3B may enable package 210 to mount to component 202 (e.g., to provide electrical connectivity for package 210 mounted to component 202 using solder bumps 206). In other words, the example GA pin-out pattern shown in FIGS. 3A and 3B may correspond to a pattern of any array of package vias 214 of package 210.

As shown in FIG. 3A, the GA pin-out pattern may include differential TX pin pairs for transmission of signals output by component 202, and differential RX pin pairs for reception of signals to be received by component 202.

In some implementations, different differential pin pairs may provide and/or receive signals using different package vias 214 and/or PCB vias 224. Additionally, or alternatively, different package vias 214 may extend to different layers of package 210 and/or different PCB vias 224 may extend to different layers of PCB 222 as described in connection with FIG. 2. For example, a first group of differential RX pin pairs (shown as RX pin pair 310-1, 310-2, 310-3, and 310-4) may correspond to PCB vias 224 that extend to a first layer of PCB 222 (e.g., layer 3, layer 5, layer 9, etc.), and a second group of differential RX pin pairs (shown as RX pin pair 320-1, 320-2, 320-3, and 320-4) may correspond to PCB vias 224 that extend to a second layer of PCB 222 (e.g., layer 9, layer 5, layer 3, etc.). That is, various differential RX pin pairs may receive signals using different PCB vias 224.

Additionally, or alternatively, a first group of differential TX pin pairs (shown as TX pin pair 330-1, 330-2, 330-3, and 330-4) may correspond to PCB vias 224 that extend to a layer of PCB 222 (e.g., layer 9, layer 5, layer 3, etc.), and/or a second group of differential TX pin pairs (shown as TX pin pair 340-1, 340-2, 340-3, and 340-4) may correspond to PCB vias 224 that extend to a fourth layer of PCB 222 (e.g., layer 3, layer 5, layer 9, etc.). That is, various differential TX pin pairs may transmit signals using different PCB vias 224.

In some implementations, the GA pin-out pattern shown in FIG. 3 may be used to support high-speed differential signals that are at least 56 gigabytes per second (Gbps). For example, for 56 Gbps differential signals, the GA pin-out pattern may have a ground via between each TX differential signal pair that is near another TX differential signal pair. Additionally, the GA pin-out pattern may have a ground via between each TX differential signal pair that is near another differential signal pair. Additionally, the GA pin-out pattern may have a ground via between each RX differential signal pair that is near another RX differential signal pair. Additionally, the GA pin-out pattern may have a ground via between a TX differential signal pair that is near an RX differential signal pair.

As another example, for 112 Gbps differential signals, the GA pin-out pattern may have a ground via between each TX differential signal pair that is near another TX differential signal pair. Additionally, the GA pin-out pattern may have a ground via between each RX differential signal pair that is near another RX differential signal pair. Additionally, the GA pin-out pattern may have two ground vias between a TX differential signal pair that is near an RX differential signal pair.

This GA pin-out pattern allows for more cross-sectional bandwidth of package 210 and/or PCB 222 than a GA pin-out pattern for a PCB assembly that is unable to rely on the GA space design pattern to enable FEXT cancellation. For example, without the GA space design pattern to enable FEXT cancellation, the GA pin-out pattern would only be able to support high-speed differential signals that are 112 Mbps if the GA pin-out pattern included two ground layers between each TX differential signal pair that is near another TX differential signal pair, two ground layers between each RX differential signal pair that is near another RX differential signal pair, and three ground layers between a TX differential signal pair that is near an RX differential signal pair. In this way, the GA space design pattern is able to improve cross-sectional bandwidth of package 210 and/or PCB 222 relative to conventional GA schemes that are unable to achieve FEXT cancellation.

As shown in FIG. 3B, the GA pin-out pattern may implemented within a PCB assembly in conjunction with the socket space design pattern shown in FIGS. 1D and 1E. For example, the GA pin-out pattern may be implemented without the ground vias shown in FIG. 3A as a result of the FEXT cancellation being performed within socket 242.

In some implementations, similar to FIG. 3A, the GA pin-out pattern may include differential TX pin pairs for transmission of signals output by component 202, and differential RX pin pairs for reception of signals to be received by component 202.

In some implementations, different differential pin pairs may provide and/or receive signals using different package vias 214 and/or PCB vias 224. Additionally, or alternatively, different package vias 214 may extend to different layers of package 210 and/or different PCB vias 224 may extend to different layers of PCB 222 as described in connection with FIGS. 2A and 2B. For example, a first group of differential RX pin pairs (shown as RX pin pair 310-1, 310-2, 310-3, 310-4, 310-5, 310-6, 310-7, and 310-8) may correspond to PCB vias 224 that extend to a first layer of PCB 222 (e.g., layer 3, layer 5, layer 9, etc.), and a second group of differential RX pin pairs (shown as RX pin pair 320-1, 320-2, 320-3, 320-4, 320-5, 320-6, 320-7, and 320-8) may correspond to PCB vias 224 that extend to a second layer of PCB 222 (e.g., layer 9, layer 5, layer 3, etc.). That is, various differential RX pin pairs may receive signals using different PCB vias 224.

Additionally, or alternatively, a first group of differential TX pin pairs (shown as TX pin pair 330-1, 330-2, 330-3, 330-4, 330-5, 330-6, 330-7, and 330-8) may correspond to PCB vias 224 that extend to a layer of PCB 222 (e.g., layer 9, layer 5, layer 3, etc.), and/or a second group of differential TX pin pairs (shown as TX pin pair 340-1, 340-2, 340-3, 340-3, 330-4, 330-5, 330-6, 330-7, and 330-8) may correspond to PCB vias 224 that extend to a fourth layer of PCB 222 (e.g., layer 3, layer 5, layer 9, etc.). That is, various differential TX pin pairs may transmit signals using different PCB vias 224.

In some implementations, the GA pin-out pattern may be used to support high-speed differential signals that are at least 56 megabytes per second (Mbps). For example, for any high-speed differential signal (e.g., 56 Mbps, 112 Mbps, 224 Mbps, 448 Mbps, etc.), the GA pin-out pattern may have RX pin pairs next to other RX pin pairs, may have TX pin pairs next to other TX pin pairs, and may have RX pin pairs next to TX pin pairs, without any of the ground vias depicted in FIG. 3A.

By enabling FEXT cancellation in socket 242, the GA pin-out pattern improves cross-sectional bandwidth of package 210 and/or PCB 222 relative to a GA pin-out pattern for a PCB assembly that is unable to rely on the GA space design pattern shown in FIGS. 1D and 1E.

While FIGS. 3A and 3B depict particular GA pin-out patterns, it should be understood that other implementations include other GA pin-out patterns. Additionally, while implementations herein describe differential pin pairs corresponding to PCB vias 224 that extend to particular layers of PCB 222, other implementations include differential pin pairs that extend to other layers of PCB 222.

In this way, the design patterns described herein (e.g., the GA space design pattern, the GA space design pattern, etc.) enable FEXT cancellation to reduce or eliminate FEXT. Additionally, the design patterns described herein improve cross-sectional bandwidth of the PCB and/or the package, increase signal density, and/or improve throughput of the PCB assembly by reducing or eliminating a number of ground vias that need to be placed between vias that support actual traffic to and from the component, and/or the like.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A socket, comprising:
 a set of pads associated with facilitating a connection through a package and to a component,
  wherein the set of pads include a set of via pads and a set of grid array (GA) pads;
 a first set of vias that are electrically connected to the set of via pads and that are connected to a set of layers that are perpendicular to the first set of vias,
  wherein the first set of vias are to be used to support differential signal pairs,
  wherein the differential signal pairs include a first differential signal pair that includes:

a first differential signal that causes crosstalk onto a particular differential signal, of a second differential signal pair, while propagating through the package, and
a second differential signal;
a first set of interconnects that electrically connect the first set of vias to the set of GA pads,
wherein the first set of interconnects include a first interconnect and a second interconnect that route the first differential signal, and the second differential signal, respectively, to offset the crosstalk that the first differential signal causes onto the particular differential signal while propagating through the package; and
a second set of interconnects that electrically connect the first set of vias to a second set of vias that are to be used to facilitate routing the differential signal pairs to the component, without the differential signal pairs propagating through a printed circuit board (PCB),
wherein the first differential signal and the second differential signal are routed to the component through interconnects, of the second set of interconnects, and through vias, of the second set of vias.

2. The socket of claim 1:
wherein the first interconnect routes the first differential signal away from the particular differential signal of the second differential signal pair, and
wherein the second interconnect routes the second differential signal toward the particular differential signal,
wherein the routed second differential signal causes an amount of crosstalk onto the particular differential signal that is proportional to an amount of crosstalk that the first differential signals causes within the package.

3. The socket of claim 1:
wherein the differential signal pairs propagate through the second set of vias to a set of socket fingers that are electrically connected to the second set of vias,
wherein the differential signals propagate through the set of socket fingers to one or more connection mechanisms that are connected to the set of socket fingers,
wherein the differential signals propagate through the one or more connection mechanisms to a set of cables that are connected to the one or more connection mechanisms, and
wherein the differential signals propagate through the set of cables to another socket that is connected to the set of cables,
wherein the other socket is to be used to route the differential signals to the component.

4. The socket of claim 1:
wherein a length of the first interconnect and a length of the second interconnect enable the first differential signal and the second differential signal to be delay matched while propagating through the package and the socket.

5. The socket of claim 1:
wherein a distance that the first differential signal propagates through a package via, of a set of package vias, is a first distance,
wherein another distance that the second differential signal propagates through a first via, of the first set of vias, is a second distance, and
wherein a length of the first interconnect and a length of the second interconnect is to offset a difference between the first distance and the second distance to enable the first differential signal and the second differential signal to be delay matched.

6. The socket of claim 1:
wherein a length of package vias that support the differential signals is a first length,
wherein the differential signal pairs include:
differential signal pairs with signal-to-noise (SNR) ratios in a first range, and
differential signal pairs with signal-to-noise (SNR) ratios in a second range, the second range being lower than the first range,
wherein a first subset of the first set of vias are used to support the differential signal pairs with SNR ratios in the first range,
wherein a length of the first subset of the first set of vias does not satisfy a threshold level of similarity with the first length, and
wherein a second subset of the first set of vias are used to support the differential signal pairs with SNR ratios in the second range,
wherein a length of the second subset of the first set of vias satisfies the threshold level of similarity with the first length.

7. The socket of claim 1:
wherein other signals are routed to the PCB using a third set of vias.

8. A printed circuit board (PCB) assembly, comprising:
a component that sends or receives differential signal pairs,
wherein the differential signal pairs include a first differential signal pair and a second differential signal pair,
wherein the first differential signal pair includes a first differential signal and a second differential signal;
a package electrically connected to the component,
wherein the first differential signal causes crosstalk onto a particular differential signal, of the second differential signal pair, while propagating through the package;
one or more sockets that are electrically connected to the package,
wherein a socket, of the one or more sockets, includes:
a set of pads associated with facilitating connections through the package and to the component,
wherein the set of pads includes a set of via pads and a set of grid array (GA) pads;
a first set of vias that is electrically connected to the set of via pads and that is connected to a set of layers that is perpendicular to the first set of vias,
a first set of interconnects that electrically connect the first set of vias to the set of GA pads,
wherein the first set of interconnects include a first interconnect and a second interconnect that route the first differential signal, and the second differential signal, respectively, to offset the crosstalk that the first differential signal causes onto the particular differential signal while propagating through the package, and
a second set of interconnects that electrically connect the first set of vias to a second set of vias that is to be used to facilitate routing the differential signal pairs to the component, without the differential signal pairs propagating through the PCB; and
a PCB connected to the one or more sockets.

9. The PCB assembly of claim 8:
wherein a length of the first interconnect and a length of the second interconnect enable the first differential signal and the second differential signal to be delay matched while propagating through the package and the socket of the one or more sockets.

10. The PCB assembly of claim 8:
wherein a length of the first interconnect and a length of the second interconnect are used to offset differences in a velocity of propagation of the first differential signal while traveling through the package and a velocity of propagation of the second differential signal while traveling through the socket, and
wherein the length of the first interconnect and the length of the second interconnect are to enable the first differential signal and the second differential signal to be delay matched while traveling through the package and the PCB.

11. The PCB assembly of claim 8:
wherein the differential signal pairs propagate through the second set of vias to a set of socket fingers that is electrically connected to the second set of vias,
wherein a distance between each via, of the second set of vias, is enough to prevent crosstalk from occurring within the second set of vias,
wherein the differential signals propagate through the set of socket fingers to one or more connection mechanisms that are connected to the set of socket fingers,
wherein the differential signals propagate through the one or more connection mechanisms to a set of cables that is connected to the one or more connection mechanisms, and
wherein the differential signals propagate through the set of cables to another socket, of the one or more sockets, that is connected to the set of cables,
wherein the other socket, of the one or more sockets, is to be used to route the differential signals to the component.

12. The PCB assembly of claim 11:
wherein the set of socket fingers do not include socket fingers dedicated to supporting ground signals.

13. An apparatus, comprising:
a set of pads associated with facilitating a connection through a package and to a component,
wherein the set of pads include a set of via pads and a set of grid array (GA) pads;
a first set of vias that is electrically connected to the set of via pads and that is connected to a set of layers that is perpendicular to the first set of vias,
wherein the first set of vias is to be used to support differential signal pairs,
wherein the differential signal pairs cause crosstalk onto other differential signal pairs while propagating through the package;
a first set of interconnects that electrically connect the first set of vias to the set of GA pads,
wherein the first set of interconnects routes the differential signal pairs in a way that offsets the crosstalk that the differential signal pairs cause while propagating through the package; and
a second set of interconnects that electrically connect the first set of vias to a second set of vias that is to be used to facilitate routing the differential signal pairs to the component, without the differential signal pairs propagating through a printed circuit board (PCB).

14. The apparatus of claim 13:
wherein the differential signal pairs include a first differential signal pair that includes:
a first differential signal causes crosstalk onto a particular differential signal, of a second differential signal pair, while propagating through the package, and
a second differential signal,
wherein the first set of interconnects include a first interconnect that the first differential signal away from the particular differential signal of the second differential signal pair, and
wherein the first set of interconnects include a second interconnect that routes the second differential signal toward the particular differential signal,
wherein the routed second differential signal causes an amount of crosstalk onto the particular differential signal that is proportional to an amount of crosstalk that the first differential signal causes within the package.

15. The apparatus of claim 13:
wherein the first set of interconnects are of a length that delay matches a time needed for the differential signal pairs to propagate through the package with a time needed for the differential signal pairs to propagate through the apparatus.

16. The apparatus of claim 13:
wherein the first set of interconnects are of a length that is used to delay match the differential signal pairs, and
wherein the length is based on a difference in a diameter of package vias used to propagate the differential signal pairs in the package and a diameter of the first set of vias used to propagate the differential signal pairs in the apparatus.

17. The apparatus of claim 13:
wherein the first set of interconnects are of a length that is used to delay match the differential signal pairs, and
wherein the length is based on a velocity of propagation of the differential signal pairs while propagating through the package in relation to a velocity of propagation of the differential signal pairs while propagating through the apparatus.

18. The apparatus of claim 13:
wherein the differential signals propagate through the second set of vias to a set of socket fingers that is electrically connected to the second set of vias,
wherein a distance between each via, of the second set of vias, is based on a signal speed of the differential signals, and is enough distance to prevent crosstalk from occurring within the second set of vias,
wherein the differential signals propagate through the set of socket fingers to one or more connection mechanisms that are connected to the set of socket fingers,
wherein the differential signals propagate through the one or more connection mechanisms to a set of cables that is connected to the one or more connection mechanisms, and
wherein the differential signals propagate through the set of cables to a backplane connector that is connected to the set of cables,
wherein the backplane connector is to be used to route the differential signals to the component.

19. The apparatus of claim 13:
wherein a length of package vias that support propagation of the differential signal pairs through the package is a first length, wherein the differential signal pairs include:
  differential signal pairs with signal-to-noise (SNR) ratios in a first range, and
  differential signal pairs with signal-to-noise (SNR) ratios in a second range, the second range being lower than the first range,
wherein a first subset of the first set of vias is to be used to support the differential signal pairs with SNR ratios in the first range,
  wherein a length of the first subset of the first set of vias does not satisfy a threshold level of similarity with the first length, and
wherein a second subset of the first set of vias is to be used to support the differential signal pairs with SNR ratios in the second range,
  wherein a length of the second subset of the first set of vias satisfies the threshold level of similarity with the first length.

20. The apparatus of claim 13:
wherein other signals are routed to the PCB using a third set of vias.

* * * * *